(12) United States Patent
Chia et al.

(10) Patent No.: US 7,183,588 B2
(45) Date of Patent: Feb. 27, 2007

(54) LIGHT EMISSION DEVICE

(75) Inventors: Chee Wai Chia, Penang (MY); Hui Peng Koay, P nang (MY); Lye Yee Wong, Penang (MY)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 67 days.

(21) Appl. No.: 10/755,047

(22) Filed: Jan. 8, 2004

(65) Prior Publication Data
US 2005/0151149 A1 Jul. 14, 2005

(51) Int. Cl.
H01L 29/22 (2006.01)
H01L 33/00 (2006.01)
H01L 29/24 (2006.01)
H01L 29/26 (2006.01)
H01L 29/267 (2006.01)

(52) U.S. Cl. ............... 257/99; 257/13; 257/79; 257/81; 257/95; 257/100; 257/666; 257/784; 257/787; 257/788; 257/793

(58) Field of Classification Search ............... 257/13, 257/79, 81, 95, 99–100, 666, 784, 787–788, 257/793
See application file for complete search history.

(56) References Cited

U.S. PATENT DOCUMENTS

| | | | |
|---|---|---|---|
| 5,998,925 A * | 12/1999 | Shimizu et al. ............. 313/503 |
| 6,054,716 A * | 4/2000 | Sonobe et al. ............. 250/552 |
| 6,335,548 B1 * | 1/2002 | Roberts et al. ............. 257/98 |
| 6,586,874 B1 * | 7/2003 | Komoto et al. ............. 313/503 |
| 6,597,019 B2 * | 7/2003 | Inoue et al. ............. 257/99 |
| 6,603,148 B1 * | 8/2003 | Sano et al. ............. 257/98 |
| 6,778,574 B1 * | 8/2004 | Shimonaka et al. ...... 372/43.01 |
| 6,956,243 B1 * | 10/2005 | Chin ............. 257/79 |
| 2002/0004251 A1 * | 1/2002 | Roberts et al. ............. 438/26 |
| 2002/0014630 A1 * | 2/2002 | Okazaki et al. ............. 257/79 |
| 2002/0121644 A1 * | 9/2002 | Ueda ............. 257/99 |
| 2002/0163001 A1 * | 11/2002 | Shaddock ............. 257/79 |
| 2003/0025449 A1 * | 2/2003 | Rossner ............. 313/512 |
| 2004/0000862 A1 * | 1/2004 | Setlur et al. ............. 313/501 |
| 2004/0052077 A1 * | 3/2004 | Shih ............. 362/294 |
| 2004/0084687 A1 * | 5/2004 | Hohn et al. ............. 257/100 |
| 2004/0104391 A1 * | 6/2004 | Maeda et al. ............. 257/79 |
| 2004/0119083 A1 * | 6/2004 | Su et al. ............. 257/98 |
| 2004/0135162 A1 * | 7/2004 | Chin et al. ............. 257/98 |
| 2004/0232435 A1 * | 11/2004 | Hofer et al. ............. 257/99 |
| 2004/0239243 A1 * | 12/2004 | Roberts et al. ............. 313/512 |
| 2004/0263074 A1 * | 12/2004 | Baroky et al. ............. 313/512 |
| 2005/0051788 A1 * | 3/2005 | Tatsumi et al. ............. 257/99 |
| 2005/0077623 A1 * | 4/2005 | Roberts et al. ............. 257/724 |
| 2005/0212089 A1 * | 9/2005 | Kiyomoto et al. ............. 257/601 |
| 2005/0231953 A1 * | 10/2005 | Reeh et al. ............. 362/260 |

* cited by examiner

Primary Examiner—Ida M. Soward

(57) ABSTRACT

A light emission device. A lead frame comprises a first lead frame segment and a second lead frame segment. A light source is coupled to the first lead frame segment. A wire bond is coupled to the light source and coupled to the second lead frame segment. A translucent epoxy cast encases the light source, the wire bond and a portion of the lead frame.

18 Claims, 6 Drawing Sheets

LIGHT EMISSION DEVICE

FIELD OF INVENTION

Various embodiments of the present invention relate to the field of light emission devices.

BACKGROUND OF THE INVENTION

Light emitting diodes (LEDs) are display devices that use a semiconductor diode that emits light when charged with electricity. LEDs provide light in a wide array of electronic devices. For example, LEDs are used as on/off indicators in electronic devices, are used to provide LCD or keypad backlighting in handheld devices, such as personal digital assistants (PDAs) and cellular telephones, and are used for digital display readouts, such as electronic signs. Typically, LEDs are manufactured into an electronic chip (e.g., LED chips) that provide for easy integration into electronic devices.

Conventional LED chips employ surface mount technology (SMT) using a printed circuit board (PCB) as a base, with the LED die encapsulated into an epoxy resin. The encapsulating process typically used is transfer molding, which utilizes high temperature and pressure to melt the mold compound and force it into the mold cavity. Due to the use of SMT and transfer molding epoxy encapsulation, there are a number of problems inherent to the used of conventional LED chips.

Typical LED chips are subject to thermal breakdown as a result of the poor thermal dissipation properties of a typical PCB. Due to the poor heat dissipation of a typical PCB, an LED used in a high power or high brightness application, may fail. Therefore, typical LED chips are restricted to low power or brightness, or have short life spans.

Furthermore, an encapsulating process using transfer molding creates an epoxy molding over an LED on top of a PCB. An LED chip subjected to the elements is prone to delamination caused by moisture absorption. Delamination causes the epoxy molding to separate from the PCB, exposing the LED die to moisture, and eventually leading to failure. Due to the wide number of electronic devices using LEDs that are exposed to the elements, delamination is a wide problem. Moreover, transfer molding requires expensive tools, machines and materials, requiring a substantial investment that is not typically viable for small- and medium-scale production.

SUMMARY OF THE INVENTION

Various embodiments of the present invention, a light emission device and a method for generating a light emission device, are described herein. In one embodiment, the light emission device comprises a lead frame comprising a first lead frame segment and a second lead frame segment. A light source is coupled to the first lead frame segment. A wire bond is coupled to the light source and coupled to the second lead frame segment. A translucent epoxy cast encases the light source, the wire bond and a portion of the lead frame.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE(S) FOR CARRYING OUT THE INVENTION

Reference will now be made in detail to various embodiments of the invention, examples of which are illustrated in the accompanying drawings. While the invention will be described in conjunction with various embodiments, it will be understood that they are not intended to limit the invention to these embodiments. On the contrary, the invention is intended to cover alternatives, modifications and equivalents, which may be included within the spirit and the scope of the invention as defined by the appended claims. Furthermore, in the following detailed description of the present invention, numerous specific details are set forth in order to provide a thorough understanding of the present invention. However, it will be apparent to one skilled in the art that the present invention may be practiced without these specific details. In other instances, well-known methods, procedures, components, structures and devices have not been described in detail so as to avoid unnecessarily obscuring aspects of the present invention.

Figure 1:
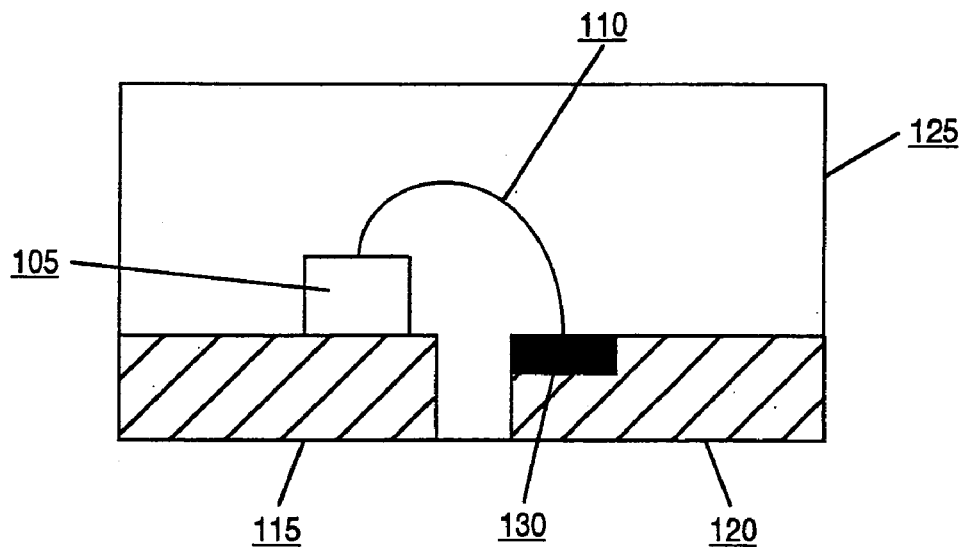
FIG. 1 illustrates a side view of a light emission device in accordance with an embodiment of the present invention.

FIG. 1 illustrates a side view of an exemplary light emission device 100 in accordance with an embodiment of the present invention. Light emission device 100 comprises light source 105, wire bond 110, and a lead frame comprising first lead frame segment 115 and second lead frame segment 120. Light source 105, wire bond 110 and at least a portion of the lead frame are encased in epoxy cast 125. It should be appreciated that a lead frame refers to a type of chip package that uses conductive leads that extend outside of a housing. In the present embodiment, a portion of first lead frame segment 115 and a portion of second lead frame segment 120 are not encased within epoxy cast 125, allowing for the transmission of power signals to light source 105.

In one embodiment, the lead frame is comprised of copper, however, it should be appreciated that any other conductive material, such as another metal, may be implemented. In one embodiment, the lead frame is covered in a plating to improve various properties of the lead frame. For example, plating may be used to improve the bonding strength between light source 105 and first lead frame segment 115 and between wire bond 110 and second lead frame segment 120, may enhance the adhesiveness of epoxy cast 125 to the lead frame, may prevent oxidization of a metal lead frame, may enhance to solderability of pads of first lead frame segment 115 and second lead frame segment 120, and can improve the surface reflectivity to enhance flux extraction. In one embodiment, the plating is nickel/palladium/gold (NiPdAu). In another embodiment, the plating is silver (Ag). It should be appreciated that any other plating material may be implemented depending on the design requirements of light emission device 100.

A lead frame provides improved thermal dissipation over the use of a PCB substrate, due to the lower thermal resistance. Light emission device 100 can be subjected to higher operating current due to the better heat dissipation properties of the lead frame. Therefore, the luminous intensity of light emission device 100 can be increased. Furthermore, light emission device 100 may have a lower profile due to a lead frame being thinner than a PCB substrate.

Light source 105 is coupled to first lead frame segment 115. In one embodiment, a power signal is received at light source 105 from first lead frame segment 115. In one embodiment, light source 105 is a light emitting diode (LED) die. While embodiments of the invention are described using an LED, it should be appreciated that other types of light sources may be implemented, such as an infrared emitting diode (IRED) or a laser diode. Wire bond 110 is coupled to light source 105 and second lead frame segment 120. Light source 105 receives positive and negative power signals via first lead frame segment 115 and wire bond 110, and emits light in response to such signals. In one embodiment, wire bond 110 is a gold wire. However, it should be appreciated than any conductive material may be implemented at wire bond 110. In one embodiment, first lead frame segment 115 operates as a cathode for transmitting a negative power signal, and second lead frame 120 operates as an anode for transmitting a positive power signal, as indicated at anode mark 130.

Epoxy cast 125 is formed over light source 105, wire bond 110, a portion of first lead frame segment 115 and an portion of second lead frame segment 120 using an epoxy casting process. The use of a conductive lead frame substrate provides for the use of a conventional casting process in forming epoxy cast 125. In one embodiment, epoxy cast 125 is comprised of substantially half epoxy resin and substantially half epoxy hardener. However, it should be appreciated that any combination of epoxy resin and epoxy hardener may be used. Epoxy cast 125 is translucent, allowing for the passage of light. In one embodiment, epoxy cast 125 comprises a color tinting for filtering the wavelength of light passing through epoxy cast 125. In one embodiment, epoxy cast 125 is operable to diffuse light passing through epoxy cast 125. Using a casting process to generate epoxy cast 125 provides a substantial cost savings over transfer molding process due to the high volume per run with high density lead frame design as well as lower initial tooling costs. Furthermore, epoxy cast 125 provides improved moisture absorption resistivity compared to molding compound which is more sensitive to moisture.

Figure 2:
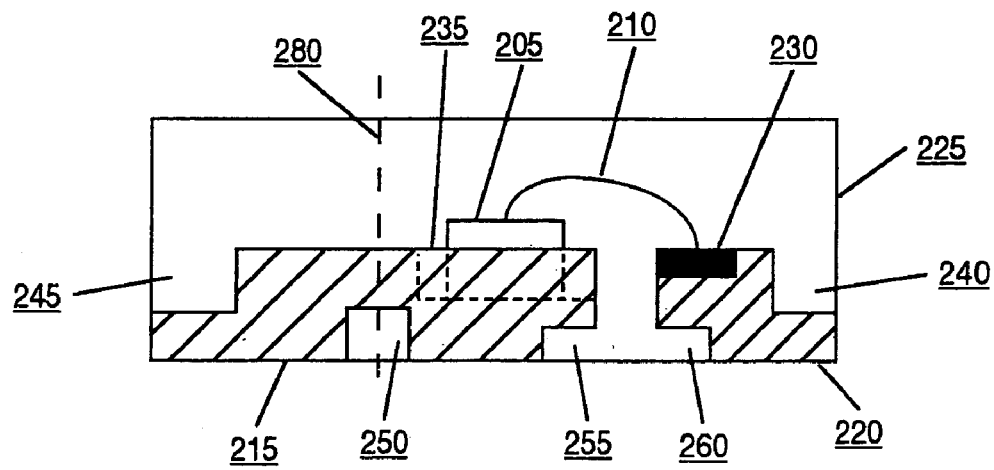
FIG. 2 illustrates a side view of a light emission device in accordance with another embodiment of the present invention.

FIG. 2 illustrates a side view of light emission device 200 in accordance with another embodiment of the present invention. Light emission device 200 comprises light source 205, wire bond 210, and a lead frame comprising first lead frame segment 215 and second lead frame segment 220. Light source 205, wire bond 210 and at least a portion of the lead frame are encased in epoxy cast 225. Light emission device 200 is similar to light emission device 100 of FIG. 1, while providing additional features.

Light emission device 200 comprises recess 235 for receiving light source 205 such that light source 205 resides at least partially within recess 235. Placing light source 205 within recess 235 assists in providing a low profile for light emission device 200, thereby allowing wider applicability. Light source 205 is coupled to first lead frame segment 215 and wire bond 210, and wire bond 210 is also coupled to second lead frame segment 220. Light source 205 receives positive and negative power signals via first lead frame segment 215 and wire bond 210, and emits light in response to such signals. In one embodiment, first lead frame segment 215 operates as a cathode for transmitting a negative power signal, and second lead frame 220 operates as an anode for transmitting a positive power signal, as indicated at anode mark 230.

Figure 3:
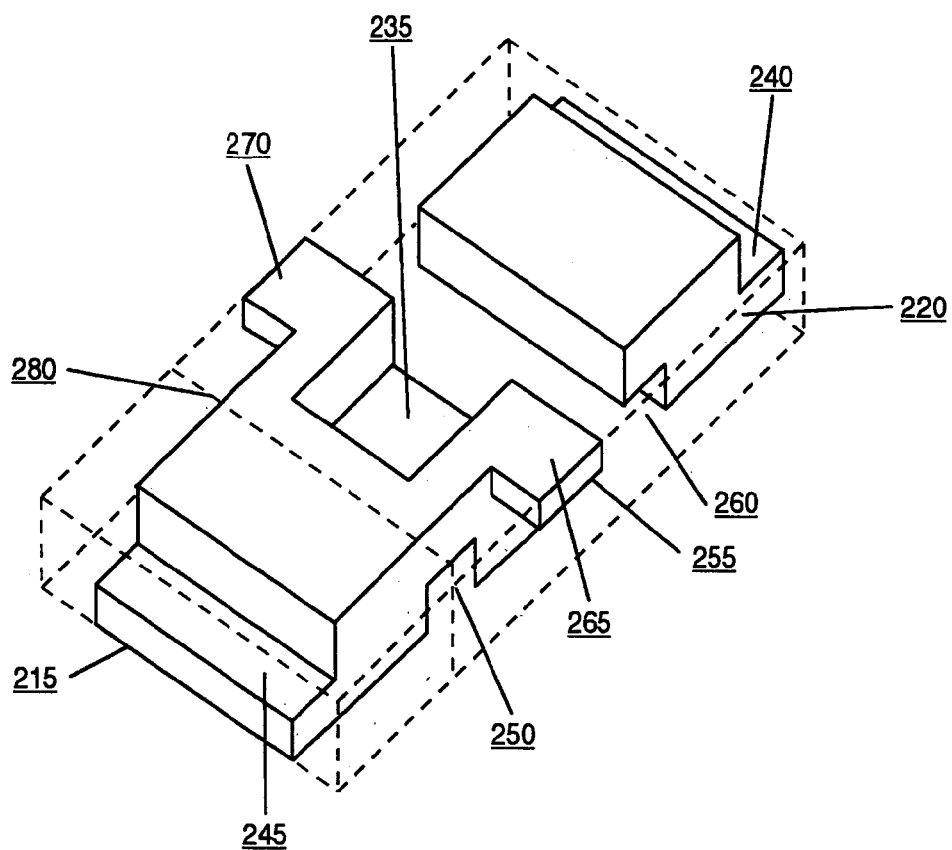
FIG. 3 illustrates an isometric view of a lead frame of a light emission device in accordance with an embodiment of the present invention.

With reference to FIG. 3, an isometric view of the lead frame of light emission device 200 is illustrated, in accordance with an embodiment of the present invention. Recess 235 is configured for receiving a light source (e.g., light source 205 of FIG. 2).

With reference to FIG. 2, the lead frame of light emission device 200 also comprises at least one anchoring recess for allowing epoxy cast 225 to be anchored to first lead frame segment 215 and second lead frame segment 220. In one embodiment, first lead frame segment 215 comprises anchoring recess 250, such that during epoxy casting, anchoring recess 250 is filled such that epoxy cast 225 is anchored to first lead frame segment 215.

Figure 4:
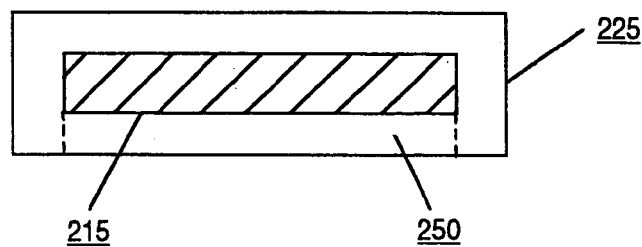
FIG. 4 illustrates a cut-away cross-sectional view of a light emission device in accordance with an embodiment of the present invention.

FIG. 4 illustrates a cut-away cross-sectional view of light emission device 200 of FIG. 2, in accordance with an embodiment of the present invention. The cut-away cross-sectional view of FIG. 4 shows the cross-sectional area of light emission device 200 at dotted line 280 of FIGS. 2 and 3. As shown in FIG. 4, the illustrated portion of first lead frame segment 215 is completely surrounded by epoxy cast 225. In particular, anchoring recess 250 is completely filled with epoxy cast 225.

With reference to FIG. 2, first lead frame segment 215 also comprises anchoring recesses 245 and 255, and second lead frame segment 220 comprises anchoring recesses 240 and 260. Anchoring recesses 240, 245, 255 and 260 provide additional anchoring functionality to the lead frame, thereby providing increased anchorage between the lead frame and epoxy cast 225. With reference to FIG. 3, first lead frame segment 215 also comprises anchoring extensions 265 and 270, providing additional anchoring functionality by locking epoxy casting 225 to first lead frame segment 215. It should be appreciated that first lead frame segment 215 and second lead frame segment 220 may comprise any number of anchoring recesses and anchoring extensions, and that those illustrated in FIGS. 2, 3 and 4 are exemplary. Improving the anchorage between the lead frame and epoxy cast 225 prevents delamination due to operation of light emission device 200 under a wide range of environmental conditions.

Figure 5A:
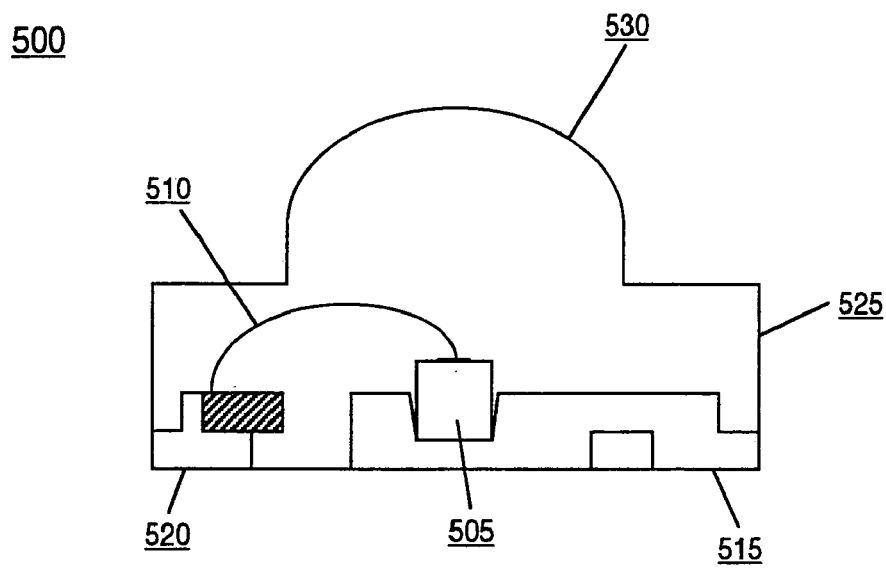
FIG. 5A illustrates a cut-away side view of a light emission device including a round shape epoxy dome in accordance with an embodiment of the present invention.

In various embodiments of the present invention, a portion of the epoxy cast may be formed into a shape, such as a dome, for directing light. FIG. 5A illustrates a cut-away side view of a light emission device 500 including a round shape epoxy dome in accordance with an embodiment of the present invention. Light emission device 500 comprises light source 505, wire bond 510, and a lead frame comprising first lead frame segment 515 and second lead frame segment 520. Light source 505, wire bond 510 and at least a portion of the lead frame are encased in epoxy cast 525. Epoxy cast 525 comprises epoxy shaped portion 530. In the illustrated embodiment, shaped portion 530 is a round shape dome. It should be appreciated that epoxy shaped portion 530 may be any shape (e.g., rectangular, triangular, cylindrical), and is not limited to the illustrated embodiment.

Figure 5B:
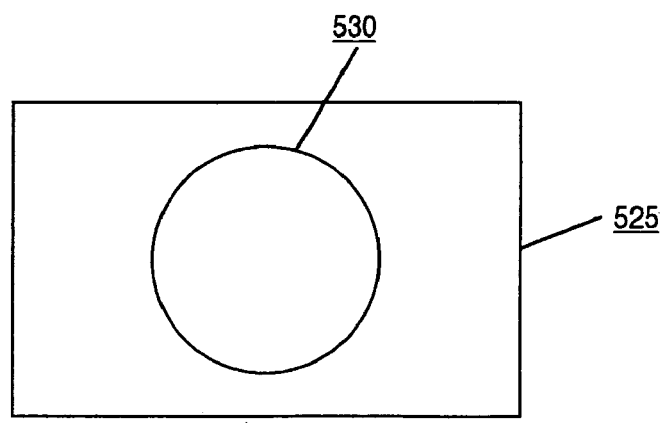
FIG. 5B illustrates a top view of a light emission device including a round shape epoxy dome in accordance with an embodiment of the present invention.

FIG. 5B illustrates a top view of light emission device 500 including a round shape epoxy dome in accordance with an embodiment of the present invention. As shown in FIG. 5B, epoxy shaped portion 530 is seen to provide for symmetric viewing angles of emitted light in all directions.

Figure 6A:
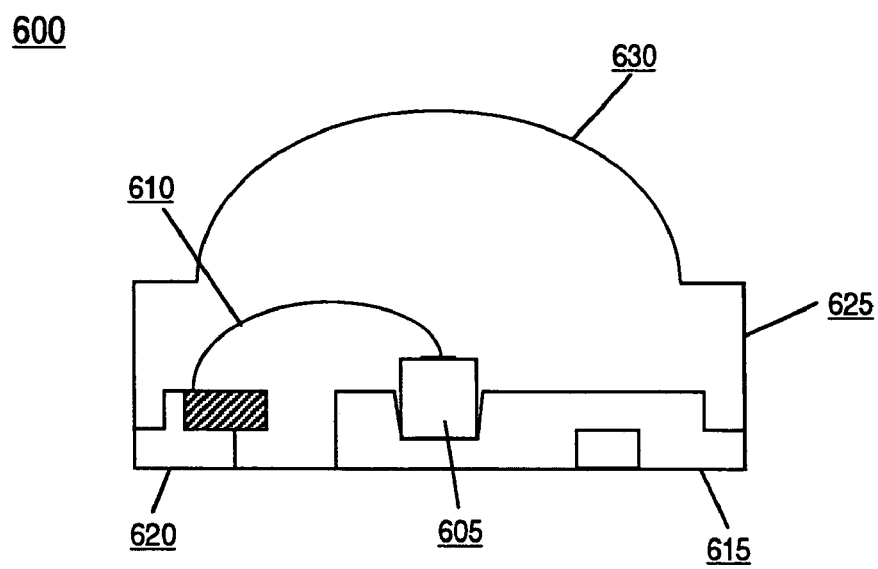
FIG. 6A illustrates a cut-away side view of a light emission device including an oval shape epoxy dome in accordance with an embodiment of the present invention.

FIG. 6A illustrates a cut-away side view of a light emission device 600 including an oval shape epoxy dome in accordance with an embodiment of the present invention. Light emission device 600 comprises light source 605, wire bond 610, and a lead frame comprising first lead frame segment 615 and second lead frame segment 620. Light source 605, wire bond 610 and at least a portion of the lead frame are encased in epoxy cast 625. Epoxy cast 625 comprises epoxy shaped portion 630. In the illustrated embodiment, shaped portion 630 is an oval shape dome. As described at FIG. 5A, it should be appreciated that epoxy shaped portion 630 may be any shape, and is not limited to the illustrated embodiment.

Figure 6B:
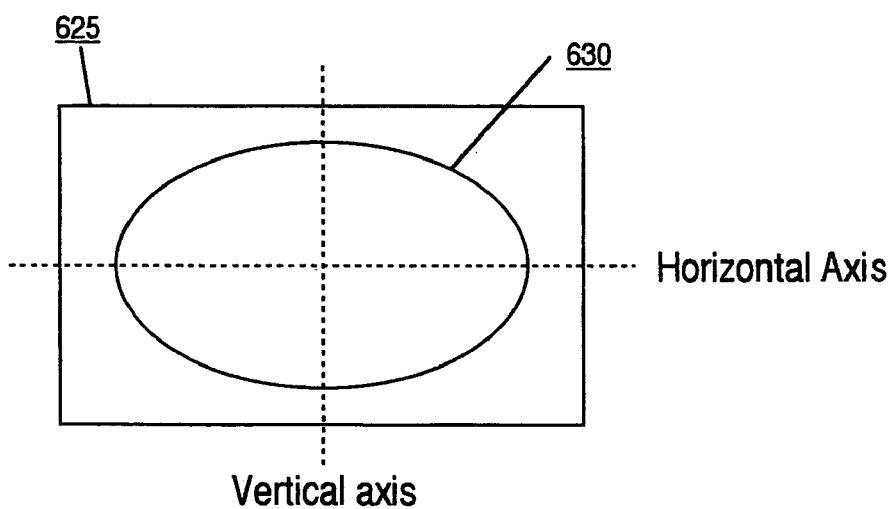
FIG. 6B illustrates a top view of a light emission device including an oval shape epoxy dome in accordance with an embodiment of the present invention.

FIG. 6B illustrates a top view of light emission device 600 including an oval shape epoxy dome in accordance with an embodiment of the present invention. As shown in FIG. 6B, epoxy shaped portion 630 is seen to provide for asymmetric viewing angles of emitted light in all directions. Using an oval shape dome, the viewing angle on the horizontal axis is greater than the viewing angle on the vertical axis.

Figure 7:
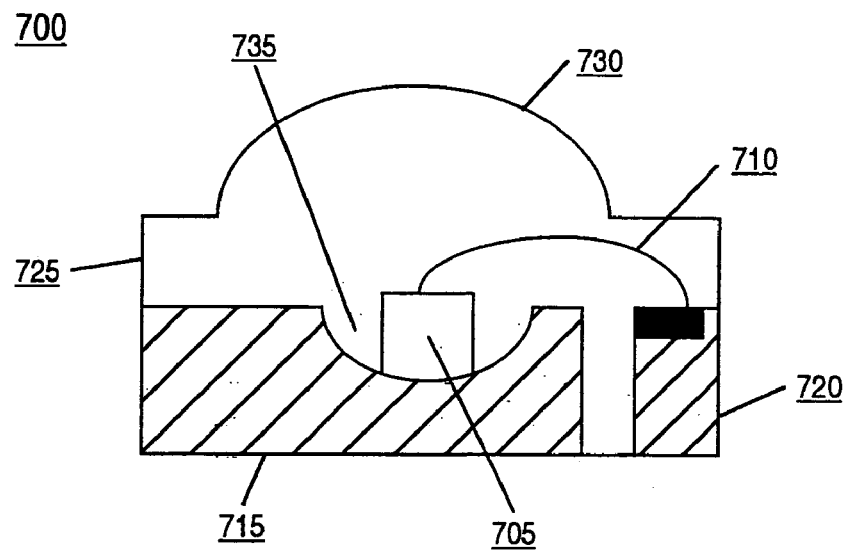
FIG. 7 illustrates a side view of a light emission device including a hemispherical reflector cup in accordance with an embodiment of the present invention.

FIG. 7 illustrates a side view of light emission device 700 including a reflector cup 735 in accordance with an embodiment of the present invention. Light emission device 700 comprises light source 705, wire bond 710, and a lead frame comprising first lead frame segment 715 and second lead frame segment 720. Light source 705, wire bond 710 and at least a portion of the lead frame are encased in epoxy cast 725. Light emission device 700 is similar to light emission device 100 of FIG. 1, while providing additional features.

Light emission device 700 comprises reflector cup 735 for receiving light source 705 and for reflecting light emitted from light source 705. In one embodiment, light source 705 resides at least partially within reflector cup 735. Placing light source 705 within reflector cup 735 allows for enhancing and directing the light emitted by light source 705. Furthermore, placing light source 705 within reflector cup 735 assists in providing a low profile for light emission device 700, thereby allowing wider applicability.

Epoxy cast 725 comprises epoxy shaped portion 730. In the illustrated embodiment, shaped portion 730 is a round shape dome. It should be appreciated that epoxy shaped portion 730 may be any shape and is not limited to the illustrated embodiment. The use of reflector cup 735 in conjunction with epoxy shaped portion 730 allows for directing the light emitted in a desired radiation pattern and viewing angle.

As described above, embodiments of the present invention are configured to implement different types of light sources. For example, embodiments of the present invention may implement a double wire bonded light source (e.g., a double wire bonded LED). A double wire bonded light source is operable to receive positive and negative power signals through two wire bonds, respectively, rather than through one wire bond and through coupling the light source to a lead frame.

Figure 8:
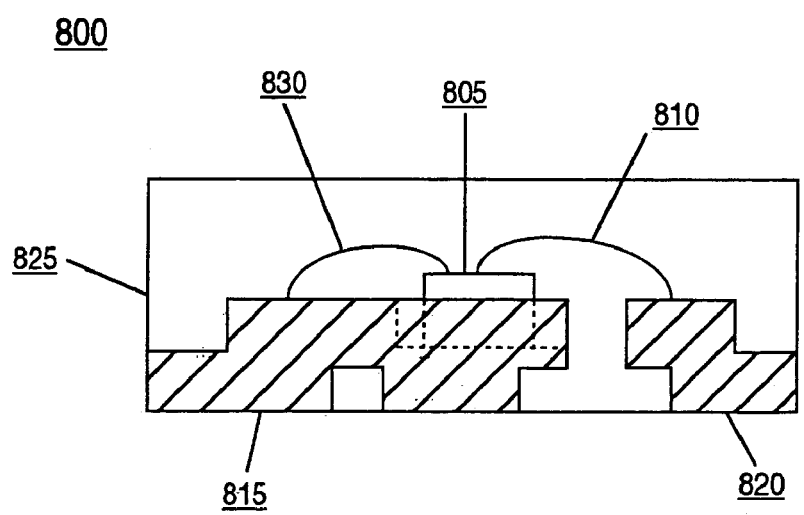
FIG. 8 illustrates side view of a light emission device including a flat top epoxy surface and including a first wire bond and a second wire bond in accordance with an embodiment of the present invention.

FIG. 8 illustrates a side view of light emission device 800 including first wire bond 810 and second wire bond 830 in accordance with an embodiment of the present invention. Light emission device 800 comprises light source 805, first wire bond 810, second wire bond 830 and a lead frame comprising first lead frame segment 815 and second lead frame segment 820. Light source 805, wire bond 810 and at least a portion of the lead frame are encased in epoxy cast 825. In one embodiment, epoxy cast 825 has a flat top surface. It should be appreciated that a lead frame refers to a type of chip package that uses conductive leads that extend outside of a housing. First wire bond is coupled to light source 805 and second lead frame segment 820 and second wire bond 830 is coupled to light source 805 and first lead frame segment 815.

Figure 9:
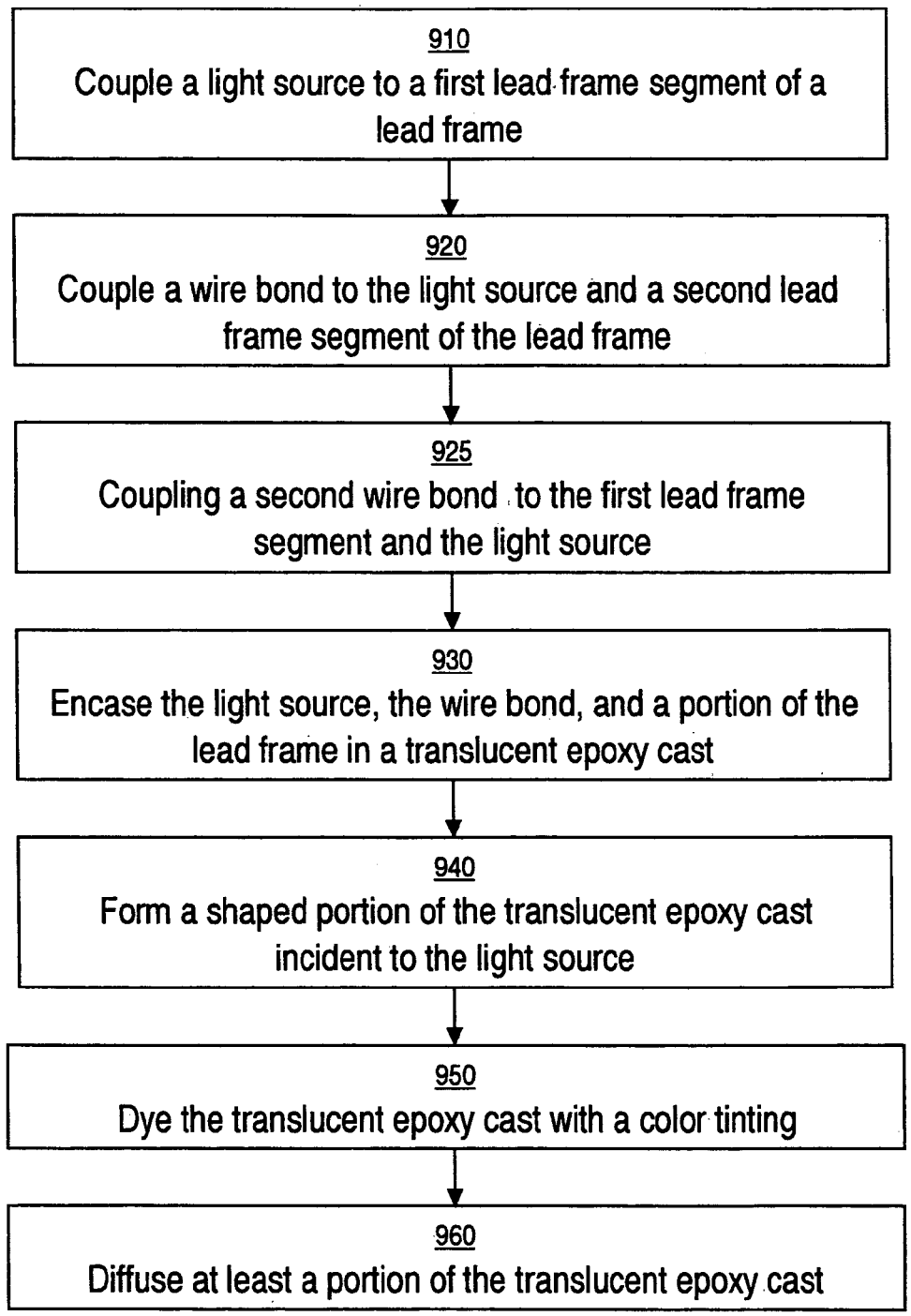
FIG. 9 is a flow chart illustrating a process for generating a light emission device in accordance with an embodiment of the present invention.

FIG. 9 is a flow chart illustrating a process 900 for generating a light emission device in accordance with an embodiment of the present invention. For purposes of clarity, the following discussion will refer to FIG. 2 to more clearly describe the present invention. However, it should be appreciated that other embodiments of the present invention may be generated according to process 900. Although specific steps are disclosed in process 900, such steps are exemplary. That is, the embodiments of the present invention are well suited to performing various other steps or variations of the steps recited in FIG. 9.

At step 910 of process 900, light source 205 is coupled to first lead frame segment 215 of a lead frame, wherein the lead frame also includes second lead frame segment 220. In one embodiment, light source 205 is an LED die. In one embodiment, first lead frame segment 215 comprises a first recess 235 such that light source 205 resides at least partially within first recess 235. In one embodiment, first recess 235 is a reflector cup (e.g., reflector cup 735 of FIG. 7).

At step 920, a wire bond is coupled to light source 205 and second lead frame segment 220. In one embodiment, as shown at step 925, a second wire bond (e.g., second wire bond 830 of FIG. 8) is coupled to first lead frame 215 and light source 205. It should be appreciated that step 925 is used when light source 205 is a double wire bonded light source. Accordingly, step 925 is optional.

At step 930, light source 205, wire bond 210, and a portion of lead frame are encased in translucent epoxy cast 225. In one embodiment, as shown at step 940, a shaped portion (e.g., shaped portion 530 of FIG. 5) of translucent epoxy cast 225 is formed. In one embodiment, the shaped portion is formed incident light source 205. In one embodiment, as shown at step 950, translucent epoxy cast 225 is dyed with a color tinting. In one embodiment, translucent epoxy cast 225 is configured to act as a diffuser.

Embodiments of the invention provide a light emission device that provides higher operating conditions with better heat dissipation. Furthermore, the light emission device has improved reliability and package robustness due to the use of a lead frame and an epoxy casting process, as well as providing better anchorage between the lead frame and the epoxy cast. Moreover, the lead frame can be etched or stamped into a desirable shape, and can provide a thinner package profile. The described embodiments also provide a light emission device that provides higher light output due to the improved heat dissipation, as well as a higher reflective surface, a reflector cup, and a shaped epoxy dome.

Various embodiments of the present invention, a light emission device, are thus described. While the present invention has been described in particular embodiments, it should be appreciated that the present invention should not be construed as limited by such embodiments, but rather construed according to the below claims.

What is claimed is:

1. A light emission device comprising:
   a lead frame comprising a first lead frame segment and a second lead frame segment, wherein said first lead frame segment comprises a first recess, wherein said first recess is a reflector cup, and wherein said first lead frame segment comprises a second recess;
   a light source coupled to said first lead frame segment, wherein said light source resides at least partially within said first recess;
   a wire bond coupled to said light source and coupled to said second lead frame segment; and
   an epoxy cast encasing said light source, said wire bond, and a portion of said lead frame, such that said epoxy cast fills said second recess for anchoring said epoxy cast to said first lead frame segment.

2. The light emission device as recited in claim 1 wherein said epoxy cast comprises a shaped epoxy portion.

3. The light emission device as recited in claim 2 wherein said shaped epoxy portion is a dome shape.

4. The light emission device as recited in claim 1 wherein said lead frame comprises plating.

5. The light emission device as recited in claim 1 wherein said epoxy cast comprises a color tinting.

6. The light emission device as recited in claim 1 wherein said epoxy cast is operable to diffuse light from said light source.

7. The light emission device as recited in claim 1 further comprising a second wire bond coupled to said first lead frame segment and said light source.

8. The light emission device as recited in claim 1 wherein said light source is a light emitting diode die.

9. The light emission device as recited in claim 1 wherein said second recess is on an opposite side of said first lead frame segment than said first recess, such that at least a portion of said first lead frame segment is completely surrounded by said epoxy cast.

10. A light emission device comprising:
    a lead frame comprising a first lead frame segment and a second lead frame segment;
    a light emitting diode coupled to said first lead frame segment, said first lead frame segment comprising a first recess such that said light emitting diode resides at least partially within said first recess, and wherein said first lead frame segment comprises a second recess;
    a wire bond coupled to said light emitting diode and coupled to said second lead frame segment; and
    an epoxy cast encasing said light emitting diode, said wire bond, and a portion of said lead frame, said epoxy cast comprising a shaped epoxy portion, wherein said epoxy cast fills said second recess for anchoring said epoxy cast to said first lead frame segment.

11. The light emission device as recited in claim 10 wherein said first recess is a reflector cup.

12. The light emission device as recited in claim 10 wherein said shaped epoxy portion is incident to said light emitting diode.

13. The light emission device as recited in claim 10 wherein said lead frame comprises plating.

14. The light emission device as recited in claim 10 wherein said epoxy cast comprises a color tinting.

15. The light emission device as recited in claim 10 wherein said epoxy cast is operable to diffuse light from said light emitting diode.

16. The light emission device as recited in claim 10 further comprising a second wire bond coupled to said first lead frame segment and said light emitting diode.

17. The light emission device as recited in claim 10 wherein said shaped epoxy portion is a dome shape.

18. The light emission device as recited in claim 10 wherein said second recess is on an opposite side of said first lead frame segment than said first recess, such that at least a portion of said first lead frame segment is completely surrounded by said epoxy cast.

* * * * *